United States Patent
Cohen et al.

(10) Patent No.: US 7,368,044 B2
(45) Date of Patent: May 6, 2008

(54) NON-CONFORMABLE MASKS AND METHODS AND APPARATUS FOR FORMING THREE-DIMENSIONAL STRUCTURES

(75) Inventors: Adam L. Cohen, Los Angeles, CA (US); Dennis R. Smalley, Newhall, CA (US)

(73) Assignee: Microfabrica, Inc., Van Nuys, CA (US)

( * ) Notice: Subject to any disclaimer, the term of this patent is extended or adjusted under 35 U.S.C. 154(b) by 710 days.

(21) Appl. No.: 10/724,513

(22) Filed: Nov. 26, 2003

(65) Prior Publication Data

US 2004/0147124 A1 Jul. 29, 2004

Related U.S. Application Data

(60) Provisional application No. 60/429,484, filed on Nov. 26, 2002.

(51) Int. Cl.
*C25D 5/02* (2006.01)
*B23H 3/00* (2006.01)

(52) U.S. Cl. .................. 205/118; 205/135; 205/666

(58) Field of Classification Search ............. 205/118, 205/135, 666
See application file for complete search history.

(56) References Cited

U.S. PATENT DOCUMENTS 5,395,508 A * 3/1995 Jolly et al. ............... 205/129

7,160,429 B2 * 1/2007 Cohen et al. ............... 205/220

FOREIGN PATENT DOCUMENTS

JP          57067193 A  *  4/1998

* cited by examiner

*Primary Examiner*—Edna Wong
(74) *Attorney, Agent, or Firm*—Dennis R. Smalley

(57) ABSTRACT

Electrochemical Fabrication techniques are used to modify substrates or to form multilayer structures (e.g. components or devices) from a plurality of overlaying and adhered layers. Masks are used to selectively etch or deposit material. Some masks may be of the contact type and may be formed of multiple materials some of which may be support materials, some of which may be mating materials for contacting a substrate and some may be intermediate materials. In some embodiments the contact masks may have conformable contact surfaces (i.e. surfaces with sufficient flexibility or deformability that they can substantially conform to surface of the substrate to form a seal with it) or they may have semi-rigid or even rigid surfaces. In embodiments where masks are used for selective deposition operations, etching operations may be performed after deposition to remove flash deposits (thin undesired deposits from areas that were intended to be masked).

8 Claims, 5 Drawing Sheets

NON-CONFORMABLE MASKS AND METHODS AND APPARATUS FOR FORMING THREE-DIMENSIONAL STRUCTURES

RELATED APPLICATIONS

This application claims benefit to U.S. Provisional Patent application No. 60/429,484, filed Nov. 26, 2002, which is incorporated herein by reference as if set fourth in full.

FIELD OF THE INVENTION

The present invention relates generally to the field of three-dimensional structure fabrication. In some embodiments, mesoscale or microscale structures are formed via electrochemical operations (e.g. electrochemical fabrication or EFAB™ processes, such as electrochemical deposition operations and/or etching operations). In some embodiments the structures are formed via deposition of a single layer of material while in other embodiments the structures are formed via a layer-by-layer build up of deposited materials. In particular, selective patterning of substrates occurs via a mask that is independent of the substrate.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen Corporation) of Van Nuys, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen Corporation) of Van Nuys, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFABTM)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

1. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1(a)-1(c). FIG. 1(a) shows a side view of a CC mask 8 consisting of a conformable or deformable (e.g. elastomeric) insulator 10 patterned on an anode 12. The anode has two functions. FIG. 1(a) also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1(b). After deposition, the CC mask is separated, preferably non-destructively, from the substrate 6 as shown in FIG. 1(c). The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g. a plaque.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication as taught and practiced to date, has greatly enhanced the capabilities of microfabrication, and in particular added greatly to the number of layers that can be incorporated into a structure and to the speed and simplicity in which such structures can be made, room for enhancing the state of electrochemical fabrication exists.

SUMMARY OF THE INVENTION

An object of some aspects of the invention is to a process for forming structures or modifying substrates using mask materials that have not been considered practical previously.

Objects and advantages of various aspects of the invention will be apparent to those of skill in the art upon review of the teachings herein. The various aspects of the invention, set forth explicitly herein or otherwise ascertained from the teaching herein, may address any one of the above objects alone or in combination, or alternatively may address some other object of the invention ascertained from the teachings herein. It is not intended that all of, or necessarily any of, the above objects be addressed by any single aspect of the invention even though that may be the case with regard to some aspects.

In a first aspect of the invention a process for forming a multilayer three-dimensional structure includes: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the surface of the protrusions that are brought in proximity to or in contact with the substrate are relatively non-deformable.

In a second aspect of the invention a process for forming a multilayer three-dimensional structure includes: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, comprises: (1) supplying a substrate on which one or more successive depositions of one or more materials may have occurred and will occur; (2) supplying a mask that comprises a support material and at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the support material is not rigid or where substantially all portions of the mask have similar flexibilities.

In a third aspect of the invention a process for forming a multilayer three-dimensional structure includes: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into a proximity but not completely contacting position with the substrate so as to form at least one an electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs.

In a fourth aspect of the invention a process for forming a multilayer three-dimensional structure includes: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the protrusion comprises at least two different materials where the material that is brought in proximity to or in contact with the substrate is less conformable than another material from which the at least one protrusion is comprised.

In a fifth aspect of the invention a process for forming a multilayer three-dimensional structure includes: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the mask comprises at least two different materials where the material that is brought in proximity to or in contact with the substrate is less conformable than another material from which the mask is comprised.

In a sixth aspect of the invention a process for modifying a substrate includes: (a) forming a layer of at least one material on a substrate that may include one or more previously deposited layers of one or more materials, wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the surface of the protrusions that are brought in proximity to, or in contact with, the substrate are relatively non-deformable.

In a seventh aspect of the invention a process for modifying a substrate includes: (a) forming a layer of at least one material on a substrate that may include one or more previously deposited layers of one or more materials, wherein the forming of at least one layer, comprises: (1) supplying a substrate on which one or more successive depositions of one or more materials may have occurred and will occur; (2) supplying a mask that comprises a support material and at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the support material is not rigid or where substantially all portions of the mask have similar flexibilities.

In an eighth aspect of the invention a process for modifying a substrate includes: (a) forming a layer of at least one material on a substrate that may include one or more previously deposited layers of one or more materials, wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into a proximity but not completely contacting position with the substrate so as to form at least one an electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs.

In a ninth aspect of the invention a process for modifying a substrate includes: (a) forming a layer of at least one material on a substrate that may include one or more previously deposited layers of one or more materials, wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the protrusion comprises at least two different materials where the material that is brought in proximity to or in contact with the substrate is less conformable than another material from which the at least one protrusion is comprised.

In a tenth aspect of the invention a process for modifying a substrate includes: (a) forming a layer of at least one material on a substrate that may include one or more previously deposited layers of one or more materials, wherein the forming of at least one layer, comprises: (1) supplying a substrate on which one or more successive depositions of one or more materials may have occurred and will occur; (2) supplying a mask that comprises at least one void and at least one surrounding protrusion of material; (3) bringing the at least one protrusion of the mask into proximity to or into contact with the substrate so as to form at least one electrochemical process pocket having a desired registration with respect to any previous depositions and providing a desired electrolyte within the at least one electrochemical process pocket; and (4) applying a desired electrical activation between at least one electrode, that may be part of the mask or separate therefrom, and the substrate, such that a desired modification of the substrate occurs; wherein the mask comprises at least two different materials where the material that is brought in proximity to or in contact with the substrate is less conformable than another material from which the mask is comprised.

In an eleventh aspect of the invention a mask for selectively controlling modification of a substrate includes: at least one void and at least one surrounding protrusion of material wherein the protrusion has an outward facing surface and the outward facing surface comprises a material that is relatively non-deformable.

In a twelfth aspect of the invention a mask for selectively controlling modification of a substrate includes: a support material and at least one void and at least one surrounding protrusion of material wherein the support material is not rigid or where substantially all portions of the mask have similar flexibilities.

In a thirteenth aspect of the invention a mask for selectively controlling modification of a substrate includes: at least one void and at least one surrounding protrusion of material having an outward facing surface, wherein the protrusion comprises at least two different materials and wherein the outward facing surface is comprised of a material that is less conformable than another material from which the at least one protrusion is comprised.

In a fourteenth aspect of the invention a mask for selectively controlling modification of a substrate includes: at least one void and at least one surrounding protrusion of material having an outward facing surface, and wherein the mask comprises at least two different materials one of which is forms the outward facing surface and which is less conformable than another material from which the mask is comprised.

In a fifteenth aspect of the invention an apparatus for forming a multilayer three-dimensional structure includes: (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; (e) at least one controller for controlling the stage and the power supply, wherein the surface of the protrusions that are brought in proximity to or in contact with the substrate are relatively non-deformable.

In a sixteenth aspect of the invention an apparatus for forming a multilayer three-dimensional structure includes: (a) a substrate on which one or more successive depositions of one or more materials may have occurred and will occur; (b) a mask that comprises a support material at least one void and at least one surrounding protrusion of material; (c) a stage for bringing the at least one protrusion of the mask into a proximity but not completely contacting position with the substrate so as to form at least one an electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs, and (e) at least one controller for controlling the stage and the power supply; wherein the support material is not rigid or where substantially all portions of the mask have similar flexibilities.

In a seventeenth aspect of the invention an apparatus for forming a multilayer three-dimensional structure includes: (a) a substrate on which one or more successive depositions of one or more materials may have occurred and will occur; (b) a mask that comprises at least one void and at least one surrounding protrusion of material; (c) a stage for bringing the at least one protrusion of the mask into a proximity but not completely contacting position with the substrate so as to form at least one an electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; and (e) at least one controller for controlling the stage and the power supply.

In an eighteenth aspect of the invention an apparatus for forming a multilayer three-dimensional structure includes: (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; and (e) at least one controller for controlling the stage and the power supply, wherein the protrusion comprises at least two different materials where the material that is brought in proximity to or in contact with the substrate is less conformable than another material from which the at least one protrusion is comprised.

In a nineteenth aspect of the invention an apparatus for forming a multilayer three-dimensional structure includes: (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; and (e) at least one controller for controlling the stage and the power supply, wherein the mask comprises at least two different materials where the material that is brought in proximity to or in contact with the substrate is less conformable than another material from which the mask is comprised.

In a twentieth aspect of the invention an apparatus for modifying a substrate includes: (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; and (d) a power supply for applying a desired electrical activation between at least one electrode, that may be part of the mask or separate therefrom, and the substrate, such that a desired modification of the substrate occurs; wherein the surface of the protrusions that are brought in proximity to or in contact with the substrate are relatively non-deformable.

In a twenty-first aspect of the invention an apparatus for modifying a substrate includes: (a) a substrate on which one or more successive depositions of one or more materials may have occurred and will occur; (b) a mask that comprises at least one void and at least one surrounding protrusion of material; (c) a stage for bringing the at least one protrusion of the mask into a proximity but not completely contacting position with the substrate so as to form at least one an electrochemical process pocket having a desired registration with respect to any previous depositions and providing a desired electrolyte within the at least one electrochemical process pocket; and (d) a power supply for applying a desired electrical activation between at least one electrode, that may be part of the mask or separate therefrom, and the substrate, such that a desired modification of the substrate occurs.

In an twenty-second aspect of the invention an apparatus for modifying substrate includes: (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; and (d) a power supply for applying a desired electrical activation between at least one electrode, that may be part of the mask or separate therefrom, and the substrate, such that a desired modification of the substrate occurs; wherein the protrusion comprises at least two different materials where the material that is brought in proximity to or in contact with the substrate is less conformable than another material from which the at least one protrusion is comprised.

In a twenty-third aspect of the invention an apparatus for modifying a substrate includes: (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; and (d) a power supply for applying a desired electrical activation between at least one electrode, that may be part of the mask or separate therefrom, and the substrate, such that a desired modification of the substrate occurs; wherein the mask comprises at least two different materials where the material that is brought in proximity to or in contact with the substrate is less conformable than another material from which the mask is comprised.

In a twenty-fourth aspect of the invention a process for forming a multilayer three-dimensional structure, includes: (a) forming a layer of at least one material on a substrate that may include one or more previously deposited layers of one or more materials; (b) repeating the forming operation of (a) one or more times to form at least one subsequent layer on at least one previously formed layer to build up a three-dimensional structure from a plurality layers; wherein the forming of at least one layer, includes: (1) supplying a substrate on which one or more successive depositions of one or more materials may have occurred and will occur; (2) supplying a mask that is either adhered to the substrate, made to contact the substrate, or that is placed in proximity to the substrate, where the mask comprises at least one void and at least one surrounding protrusion of material, and wherein the positioning of the mask relative to the substrate forms at least one electrochemical process pocket having a desired registration with respect to any previous depositions and providing a desired electrolyte within the at least one electrochemical process pocket; (3) applying a desired electrical activation between at least one electrode, that may be part of the mask or separate therefrom, and the substrate, such that a selective deposition to the substrate occurs; (4) after application of the a desired electric activation, removing the mask from its adhered, contacted, or proximate positioning to the substrate; and (5) performing an etch of the deposited material to at least partially clean up any deposition of material that occurred in a region of the substrate that was intended to be masked.

In a twenty-fifth aspect of the invention a process for making a selective deposit to a substrate, includes: (a) supplying a substrate on which one or more successive depositions of one or more materials may have occurred and will occur; (b) supplying a mask that is either adhered to the substrate, made to contact the substrate, or that is placed in proximity to the substrate, where the mask comprises at least one void and at least one surrounding protrusion of material, and wherein the positioning of the mask relative to the substrate forms at least one electrochemical process pocket having a desired registration with respect to any previous depositions and providing a desired electrolyte within the at least one electrochemical process pocket; (3) applying a desired electrical activation between at least one electrode, that may be part of the mask or separate therefrom, and the substrate, such that a selective deposition to the substrate occurs; (4) after application of the a desired electric activation, removing the mask from its adhered, contacted, or proximate positioning to the substrate; and (5) performing an etch of the deposited material to at least partially clean up any deposition of material that occurred in a region of the substrate that was intended to be masked.

Further aspects of the invention will be understood by those of skill in the art upon reviewing the teachings herein. Other aspects of the invention may involve combinations of the above noted aspects of the invention. Still other aspects of the invention may provide other configurations, apparatus, functional relationships, and processes that have not been specifically set forth above.

DETAILED DESCRIPTION OF PREFERRED EMBODIMENTS OF THE INVENTION

FIGS. 1A-C, 2A-2F, and 3A-3C illustrate various aspects of electrochemical fabrication that are known. Other electrochemical fabrication techniques are set forth in the '630 patent, in the various previously incorporated publications, in patent applications incorporated herein by reference, still other may be derived from combinations of various approaches described in these publications, patents, and applications, or are otherwise known or ascertainable by those of skill in the art. All of these techniques may be combined with those of the present invention to yield enhanced embodiments.

Figure 1A:
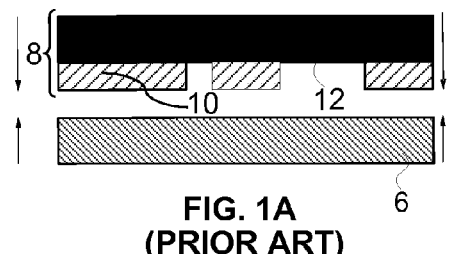
FIGS. 1A-1C schematically depict side views of various stages of a CC mask plating process, while FIGS. 1D-1G schematically depict a side views of various stages of a CC mask plating process using a different type of CC mask.
Figure 1B:
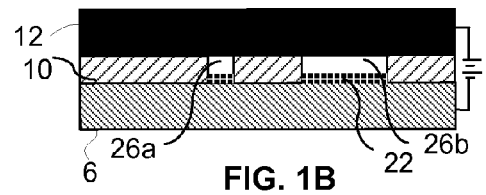
Figure 1C:
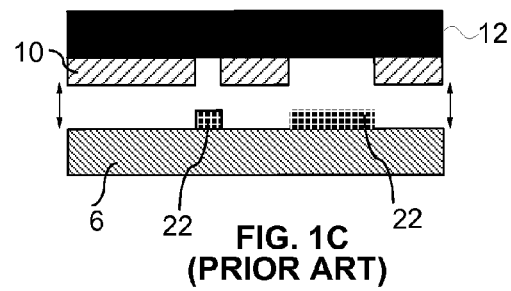
Figure 1D:
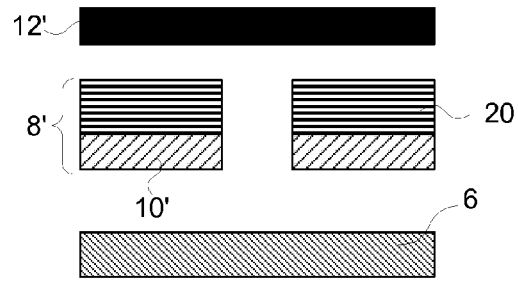
Figure 1E:
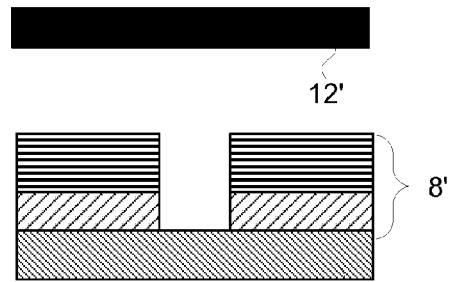
Figure 1F:
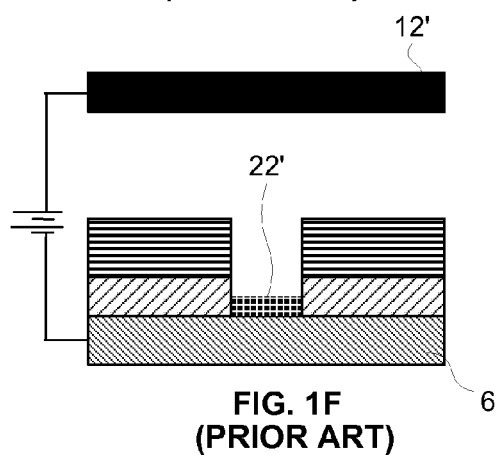
Figure 1G:
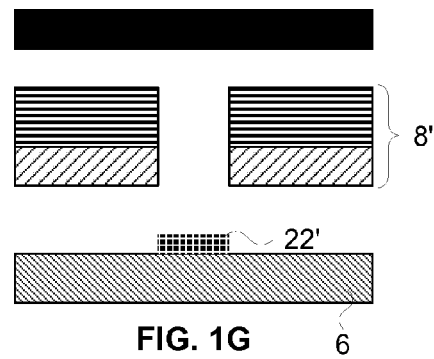
Figure 2A:
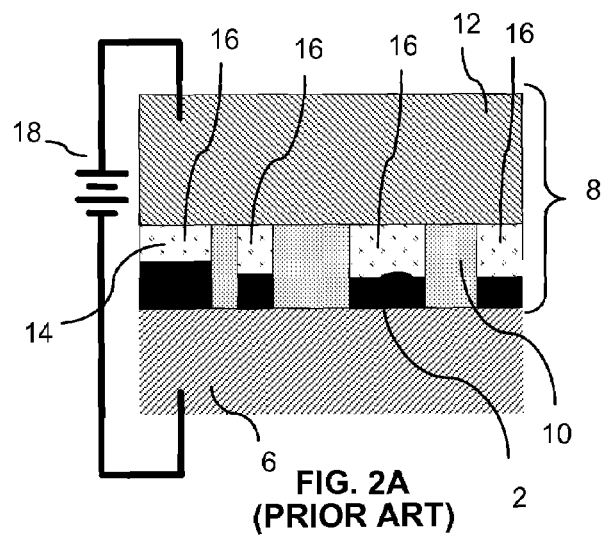
FIGS. 2A-2F schematically depict side views of various stages of an electrochemical fabrication process as applied to the formation of a particular structure where a sacrificial material is selectively deposited while a structural material is blanket deposited.
Figure 2B:
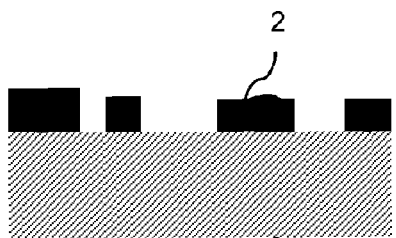
Figure 2C:
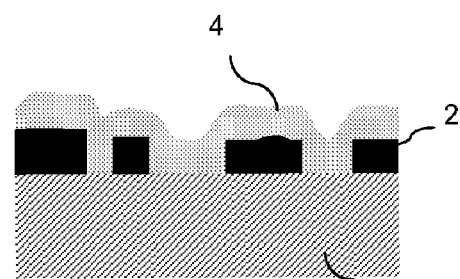
Figure 2D:
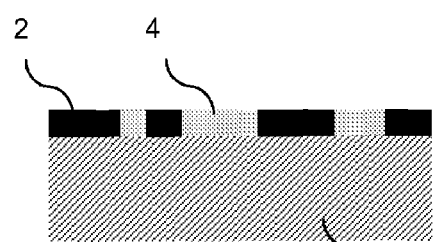
Figure 2E:
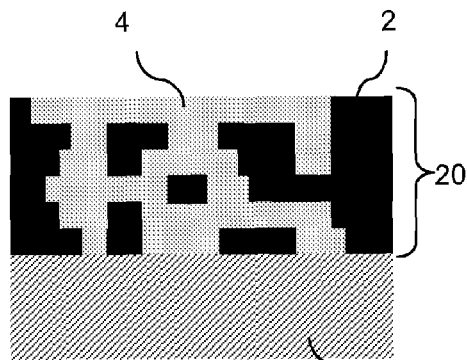
Figure 2F:
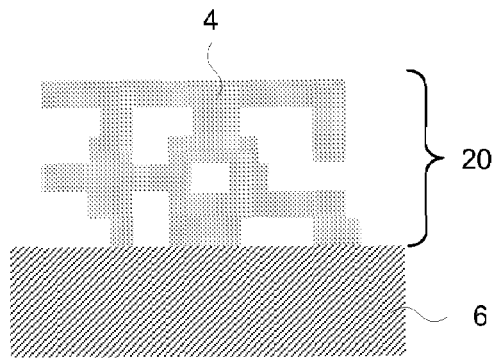
Figure 3A:
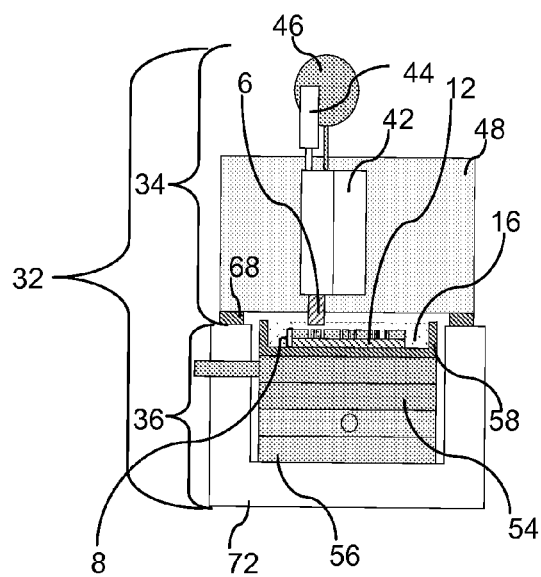
FIGS. 3A-3C schematically depict side views of various example subassemblies that may be used in manually implementing the electrochemical fabrication method depicted in FIGS. 2A-2F.
Figure 3B:
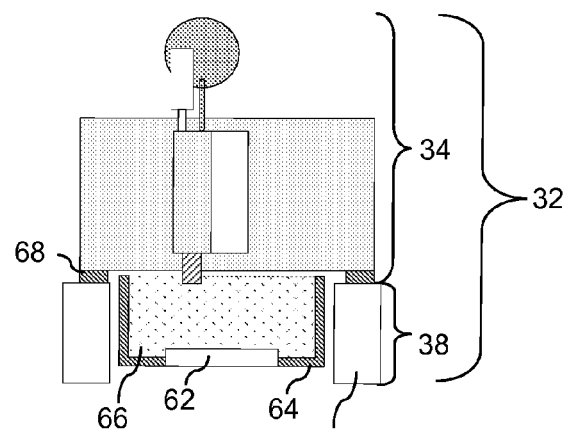
Figure 3C:
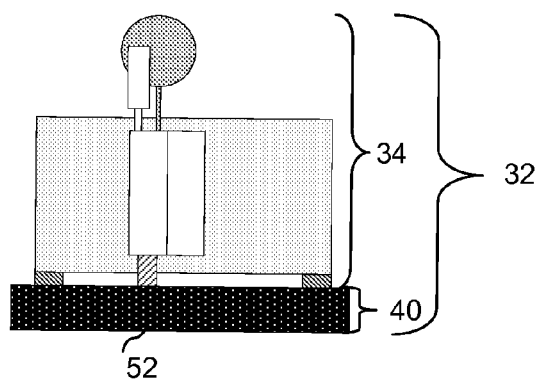
Figure 4A:
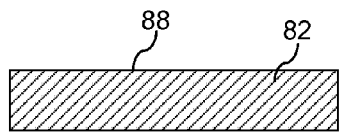
FIGS. 4A-4I schematically depict the formation of a first layer of a structure using adhered mask plating where the blanket deposition of a second material overlays both the openings between deposition locations of a first material and the first material itself.
Figure 4C:
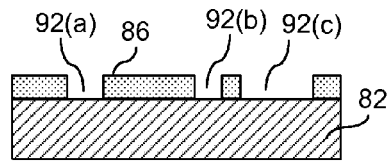
Figure 4B:
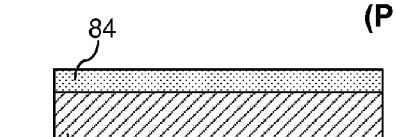
Figure 4D:
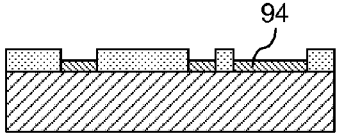
Figure 4E:
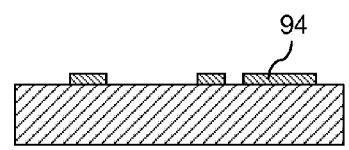
Figure 4F:
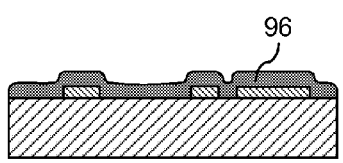
Figure 4G:
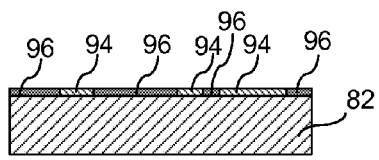
Figure 4H:
Figure 4I:
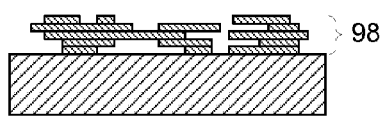

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4R. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Electrochemical Fabrication may be used to form multi-layer structures (e.g. components, devices, or systems) from a plurality of overlaying and adhered layers. Masks, that are independent of a substrate to be operated on, are used in some embodiments of the invention. When forming a single layer structure, such a mask is used to achieve selective patterning of at least one material. During formation of a multi-layer structure such a mask may be used in forming a single layer, a plurality of layers, or even all layers of a multilayer structure. In some embodiments, such masks may be used multiple times during the formation of a given single layer. In various embodiments of the invention these masks may allow selective deposition of material onto the substrate or they may allow selective etching of a substrate where the created voids may be filled with a selected material that may then be planarized to yield in effect a net selective deposition of the selected material. Such masks may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, such masks may have conformable contact surfaces (i.e. surfaces with sufficient deformability or flexibility that they can substantially conform to a surface of the substrate to form a seal with it) or they may have semi-rigid or even rigid surfaces. In some embodiments, adhered masks may be used. In some embodiments, where masks of the contact, proximity and/or adhered type are used to selectively deposit material, post deposition etching operations may be performed to remove flash deposits (i.e. thin undesired deposits that result from imperfect mating between a mask and the substrate).

Figure 5:
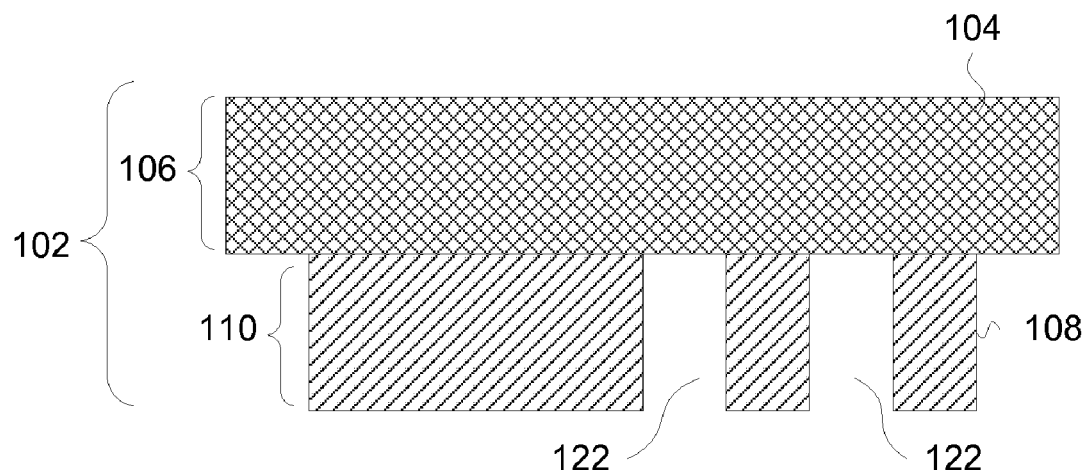
FIG. 5 depicts a mask useable with certain embodiments of the invention where the mask includes two materials.

FIG. 5 schematically depicts a side view of an example of a mask according to a first set of embodiments of the invention where the mask 102 includes at least two materials, a first material 104 for a support portion 106 of the mask, and a second material 108 for a protruding portion 110 of the mask where the protrusion surrounds (or defines) openings (or voids) 122. In this example the first material has a first flexibility (i.e. deformability or conformability) and the second material has a second flexibility.

In a first implementation of the mask of FIG. 5, the first material may have a flexibility greater than that of the second material. For example the first material may be flexible while the second material is semi-flexible or even relatively rigid. Alternatively the first material may be semi-flexible while the second material is rigid. The flexibility and rigidity of the material as described herein refers to the degree of conformability (i.e. plasticity) or lack thereof of the materials when undergoing mating pressures used for sealing (e.g. I to 100 PSI).

In another implementation, the first and second materials may have substantially the same flexibility, either rigid-rigid, semi-flexible-semi-flexible, or flexible-flexible.

In a further implementation, the first material may be flexible while the second material may have even a greater flexibility.

It is believed that enhancing the flexibility of the first material over that which has been proposed previously may enhance the ability to mate masks and substrates as they both become larger in cross-sectional dimension. It is believed that if the first material is flexible or semi-flexible it may be able to enhance the mating of the second material of the mask to the substrate by accommodating for larger scale variations in planarity of either the mask or the substrate than can be accommodated for by the flexibility of the second material alone. Similarly, such flexibility may be better able to accommodate larger variations in orientation between the mask and the substrate than can be accommodated by the second material alone.

Figure 6:
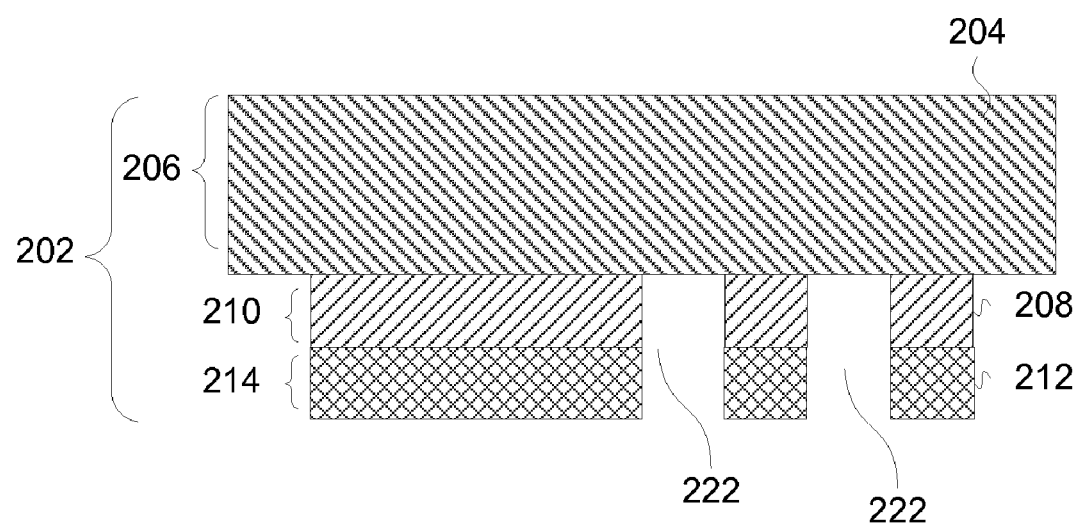
FIG. 6 depicts a mask useable with certain embodiments of the invention where the mask includes three materials.

FIG. 6 depicts an example of a mask according to a second embodiment of the invention where the mask 202 includes at least three materials, a first material 204 for a support portion 206 of the mask, a second material 208 for the intermediate protruding portion 210 of the mask where the protrusion partially surrounds (or defines) openings (or voids) 222 and, a third material 212 for the outward protruding portion 214 of the mask. In this example the first material has a first flexibility (i.e. deformability or conformability), the second material has a second flexibility, and the third material has a third flexibility.

In a first implementation of the mask of FIG. 6, the second material may have a flexibility that is greater than the flexibility of either of the first or third materials. For example, the flexibility of the first, second, and third materials (first-second-third) may, respectively, be: (1) rigid-semi-flexible-rigid, (2) rigid-flexible-rigid, (3) semi-flexible-flexible-semi-flexible, (4) rigid-flexible-semi-flexible, or (5) semi-flexible-flexible-rigid.

In a second implementation, the flexibility of the second material may be less than that of the other two materials. For example, the flexibility of the first, second, and third materials may, respectively, be: (1) semi-flexible-rigid-semi-flexible, (2) semi-flexible-rigid-flexible, (3) flexible-rigid-semi-flexible, (4) flexible-rigid-flexible, (5) flexible-semi-flexible-flexible.

In a third implementation, the flexibility of the third material may be less than that of the first and second materials. For example, the flexibility of the first, second, and third materials may, respectively, be: (1) semi-flexible-semi-flexible-rigid, (2) semi-flexible-flexible-rigid, (3) flexible-semi-flexible-rigid, (4) flexible-flexible-rigid, or (5) flexible-flexible-semi-flexible.

In a fourth implementation, the flexibility of the first material may be greater than that of either the second or the third materials. For example, the flexibility of the first, second, and third materials may, respectively, be: (1) semi-flexible-rigid-rigid, (2) flexible-semi-flexible-rigid, (3) flexible-semi-flexible-semi-flexible, (4) flexible-rigid-semi-flexible; or (5) flexible-rigid-rigid.

In additional implementations other relationships concerning the flexibility of the various mask layers may exist. For example, in some embodiments the first, second, and third materials may take on the following flexibilities, respectively: (1) rigid-rigid-rigid, (2) semi-flexible-semi-flexible-semi-flexible, (3) semi-flexible-semi-flexible-flexible, or (4) semi-flexible-flexible-flexible, or (5) flexible-flexible-flexible.

When the first material is flexible or semi-flexible, it may be possible to manipulate the mask shape during mating and un-mating with the substrate such that mating may occur in a manner so as to leave paths for excess electrolyte to escape (e.g. when the mask is mated to the substrate from one side and then working to the other side; when the mask is mated to the substrate first in the center and mating is continued by working toward the sides, or when the mating may occur in a geometry sensitive manner). Similarly when removing the mask from a mated position it may be possible to flex the mask to cause unsealing to occur from one edge first and then have it propagate to the other edge or from all edges and then to the center. In embodiments where the flexing or flexibility of the first material will be used in either mating or un-mating masks and substrate, the masks may be of either the two-part configuration (i.e. FIG. 5), the three-part configuration (i.e. FIG. 6), or of some other configuration. In such embodiments, the mask material that mates with the substrate may have a flexibility that is equal to that of the other materials, less than that of the other materials, or even greater than that of the other materials.

In some embodiments the invention may be practiced to form multi-layer three-dimensional structures for example by forming a layer of at least one material on a substrate that may include one or more previously deposited layers of one or more materials and then repeating the forming operation of one or more times to form at least one subsequent layer on at least one previously formed layer to build up a three-dimensional structure from a plurality layers. The formation of at least one layer may include (1) supplying a substrate on which one or more successive depositions of one or more materials may have occurred and will occur; (2) supplying a mask that includes at least one void and at least one surrounding protrusion of material; (3) bringing the at least one protrusion of the mask into proximity to or into contact with the substrate so as to form at least one electrochemical process pocket having a desired registration with respect to any previous depositions, or features of the substrate, and providing a desired electrolyte within the at least one electrochemical process pocket; and (4) applying a desired electrical activation between at least one electrode, that may be part of the mask or separate therefrom, and the substrate, such that a desired modification of the substrate occurs.

In some embodiments the invention may be practiced so as to modify a substrate, for example, by forming a layer of at least one material on a substrate that may include one or more previously deposited layers of one or more materials, wherein the forming of at least one layer, includes (1) supplying a substrate on which one or more successive depositions of one or more materials may have occurred and will occur; (2) supplying a mask that includes at least one void and at least one surrounding protrusion of material; (3) bringing the at least one protrusion of the mask into proximity to or into contact with the substrate so as to form at least one electrochemical process pocket having a desired registration with respect to any previous depositions, or features of the substrate, and providing a desired electrolyte within the at least one electrochemical process pocket; and (4) applying a desired electrical activation between at least one electrode, that may be part of the mask or separate therefrom, and the substrate, such that a desired modification of the substrate occurs.

In some embodiments the invention may take the form of an apparatus for modifying a substrate or a producing multilayer three-dimensional structure, which for example, may include (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions, or features of the substrate, and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; and (e) preferably (e.g. for the apparatus for forming multilayer structures), but not necessarily, a least one controller for controlling the stage and the power supply.

The substrate may for example be in the form of a conductive material (e.g. a selected metal, or the like), a moderately conductive material (e.g. doped silicon, or the like), a dielectric or mixed dielectric/conductor/semiconductor base on which a conductive seed layer has been completely or partially formed. The stage may include a translational stage driven by a motor or stepper motor (e.g. that drives a ball screw or other mechanism for translating rotational motion to translational motion), it may alternatively or additionally include a pressure driven expanding or collapsing bellows or piston mechanism. The stage may include an encoder for position and it may include multiple stages such as course movement stages and fine movement stages. It may allow linear motion in all three directions and/or rotational motion. The power supply may take on any appropriate form required to drive the given reaction. For example it may be a DC or pulsed DC supply, it may be controlled to output a fixed current or fixed voltage or a variable current or variable voltage. It may include feedback for accurate control. The controller may take a variety of forms. For example, it may be a computer programmed in a manner to control the other components in a desired way (e.g. to repeat operations a plurality of times to build up multi-layer structures) or it may be individual control elements for different apparatus components that are each controlled by an operator. The computer may include a monitor and/or printer for supplying information to an operator, a keyboard, mouse, touch screen, or the like for accepting input form an operator. The computer may be connected to a network to allow remote control of the system or control of multiple systems from or by a single computer, the computer may include storage capacity for storing data associated with the formation of a structure.

Many other apparatus components may also be incorporated into some embodiments: (1) a rigid frame for holding system components with appropriate accuracy and shielding panels for allowing a controlled environment to exist, (2) controlled air or gas systems, (3) temperature control systems, (4) substrate cleaning systems, (5) substrate activation systems, (6) plating systems and electrolyte replacement or cleaning systems, (7) air filters and circulation systems, (8) planarization systems, (9) process monitoring equipment such as cameras, data acquisition and storage systems, (10) access doors and panels, (11) viewing windows or cameras and monitors, (12) operator warning systems, including lights and auditory signals, and the like.

In alternative embodiments, masks may have protrusions that include more than two or even three materials or even a mixture of a number of different materials dependent on cross-sectional location within the mask. In still other embodiments, the mask support structure may include more than two materials where, for example, a more flexible material may be located adjacent to the protruding material or it may be located adjacent to an additional mask support structure (not shown).

In alternative embodiments, the masks described above may be of the anode-less or electro-less type. Such masks were described herein above in association with FIGS. 1D-1G. They are described in U.S. Pat. 6,027,630, referenced herein above as well as in U.S. Patent Application Nos. 60/429,483 and 10/677,498. The former of which was filed on Nov. 26, 2002 while the later was filed on Oct. 1, 2003. Both were filed by Adam L. Cohen, et al. and were entitled "Multi-Cell Masks and Methods and Apparatus for Using Such Masks To Form Three-Dimensional Structures". Both of these patent applications are incorporated herein by reference as if set forth in full.

In some embodiments the protruding material of the mask may be pressed against a substrate while in other embodiments the protruding material may be brought in proximity to the substrate but not touching it or at least not all openings of the mask being sealed by contact between the substrate and the protruding material. It is preferred that in embodiments where proximity positioning of the mask is to occur that the positioning be close enough that deposition outside the region of the mask openings (or voids) receive a deposition that is no thicker than about 1-2 µm (micron) and more preferably no thicker than about 0.5-1 µm. In other embodiments, it is preferred that when proximity positioning is used, intentionally or otherwise, that depositions outside the mask openings will not exceed 20% of the desired height of the deposition that is to occur within the openings, more preferably less than about 10%, and most preferably less than about 5%. These same numbers and percentages preferably hold when deposition is to occur using mating of rigid mask surfaces to a substrate. These same numbers and percentages preferably hold, mutatis mutandis, for situations where the mask is to be used for etching operations.

As noted above, the masks used in the various embodiments of the present invention may be used for either selectively depositing material or for selectively etching material. Techniques for building three-dimensional structures in combination with selective etching operations is more full described in U.S. application Ser. No. 10/434,519, filed on May 7, 2003, by Dennis R. Smalley entitled "Methods of and Apparatus for Electrochemically Fabricating Structures Via Interlaced Layers or Via Selective Etching and Filling of Voids" which is herein incorporated by reference as if set forth in full. This referenced application also discloses techniques for forming multilayer three-dimensional structures on a layer-by-layer basis where building deviates from a strict planar layer on planar layer build up process in favor of a process that interlaces material deposited on some or all layers. These alternative formation techniques may be used in combination with the masks and mask mating techniques disclosed explicitly herein The masks, masking techniques, and structure formation techniques disclosed explicitly herein may benefit by using the enhanced mask mating techniques disclosed in U.S. Patent Application No. 60/525,797 filed Nov. 26, 2003 by Jeffrey A. Thompson and entitled "EFAB Methods Including Controlled Mask to Substrate Mating". This referenced application is incorporated herein by reference as if set forth in full herein. This referenced application teaches the treatment of substrates, formation of structures, and formation of multilayer structures using contact masks where a controlled mating of contact masks and substrates is used. Some embodiments involve controlled mating at speeds equal to or less than 10 microns/second, more preferably equal to or less than 5 microns/second, and even more preferably equal to or less than 1 micron/second. Some embodiments involve controlled mating that uses a higher speed of approach when further away and a slower speed of approach to cause mating. Some embodiments involve controlled mating that uses a higher speed of approach when making a preliminary contact, then backing away a desired distance, and then making a mating approach that cause mating while using a slower mating speed.

The masks, masking techniques, and structure formation techniques disclosed explicitly herein may benefit by using the enhanced mask mating techniques disclosed in U.S. patent application Ser. No. 10/724,515 filed Nov. 26, 2003 by Adam L. Cohen et al. and entitled "Method for Electrochemically Forming Structures Including Non-Parallel Mating of Contact Masks and Substrates". This referenced application is incorporated herein by reference as if set forth in full herein. This referenced application teaches the treatment of substrates, formation of structures, and formation of multilayer structures using contact masks where a non-parallel or non-simultaneous mating and/or un-mating of various mask contact surfaces to a substrate surface occurs. Some embodiments involve bringing a relative planar mask contact surface and a relative planar substrate surface together at a small angle (but larger than an alignment tolerance associated with the system). Some embodiments involve flexing a mask to make it non-planar and bringing it into contact with a substrate such that progressively more contact between the mask and substrate occur until complete mating is achieved.

Various other embodiments of the present invention exist. Some of these embodiments may be based on a combination of the teachings herein with various teachings incorporated herein by reference. Some embodiments may form structures without using any blanket deposition processes and/or they may not use planarization processes. Some embodiments may involve the selective deposition of a plurality of different materials on a single layer or on different layers. Some embodiments may use selective or blanket depositions processes that are not electrodeposition processes. Some embodiments may use selective deposition processes on some layers that are not proximity or contact masking processes (e.g. they may be contact masking processes or even direct patterning processes) and that are not even electrodeposition processes (e.g. they may be PVD processes, electroless deposition process, electrophoretic deposition processes, or the like). Some embodiments may use nickel as a structural material while other embodiments may use different materials such as, for example, gold, silver, or any other electrodepositable materials that can be separated from the copper and/or some other sacrificial material. Some embodiments may use copper as the structural material with or without a sacrificial material. Some embodiments may remove a sacrificial material while other embodiments may not. In some embodiments the anode may be different from a proximity or contact mask support and the support may be a porous structure or other perforated structure. Some embodiments may use multiple proximity or contact masks with different patterns so as to deposit different selective patterns of material on different layers and/or on different portions of a single layer. In some embodiments, the depth of deposition will be enhanced by pulling the proximity or contact mask away from the substrate as deposition is occurring in a manner that allows a seal between the a portion of the CC mask and the substrate to shift from the face of mask to the inside edges of the mask.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A process for forming a multilayer three-dimensional structure, comprising:
   (a) forming a first layer comprising at least one structural material and at least one sacrificial material on a substrate that may include one or more previously formed layers each formed from the at least one structural material and the at least one sacrificial material; and (b) repeating the forming of (a) one or more times to form at least one subsequent layer on and adhered to the first layer or on and adhered to a previously formed subsequent layer to build up a three-dimensional structure from a plurality of adhered layers;

wherein the forming of at least one layer of the plurality of adhered layers, comprises:

(1) supplying a mask that comprises at least one void and at least one surrounding protrusion of material;

(2) bringing the at least one protrusion of the mask into proximity to or into contact with the substrate or a selected previously formed layer so as to form at least one electrochemical process pocket having a desired registration with respect to the substrate or the selected previously formed layer, and providing a desired electrolyte within the at least one electrochemical process pocket; and (3) applying a desired electrical activation between at least one electrode, that may be part of the mask or separate therefrom, and the substrate or the selected previously formed layer, such that a desired modification of the substrate or the selected previously formed layer occurs during the forming of the at least one layer, wherein the mask comprises at least two different materials where the material that is brought in proximity to or in contact with the substrate or the selected previously formed layer is less conformable than another material from which the mask is comprised.

2. The process of claim 1 wherein the mask is an electrodeless mask.

3. The process of claim 1 wherein the mask comprises an electrode that is used for deposition or etching.

4. The process of claim 1 wherein the desired modification comprises a selective deposition of the at least one structural material or the at least one sacrificial material.

5. The process of claim 4 additionally comprising a planarization of the selective deposition of the at least one structural material or the at least one sacrificial material.

6. The process of claim 4, wherein the mask is used to selectively deposit the at least one structural material or the at least one sacrificial material and an etching operation is performed after the deposition to reduce the presence of any unwanted depositions.

7. The process of claim 1 wherein the desired modification operates on the selected previously formed layer and where the desired modification comprises a selective etching of the at least one structural material or at least one sacrificial material which forms part of the selected previously formed layer.

8. The process of claim 7 additionally comprising a planarization operation.

\* \* \* \* \*